US011411091B2

(12) United States Patent
Yin et al.

(10) Patent No.: US 11,411,091 B2
(45) Date of Patent: Aug. 9, 2022

(54) STRUCTURE OF STACKED GATE-ALL-AROUND NANO-SHEET CMOS DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Huaxiang Yin, Beijing (CN); Tianchun Ye, Beijing (CN); Qingzhu Zhang, Beijing (CN); Jiaxin Yao, Beijing (CN)

(73) Assignee: Institute of Microelectronics, Chinese Academy of Sciences

( * ) Notice: Subject to any disclaimer, the term of this patent is extended or adjusted under 35 U.S.C. 154(b) by 178 days.

(21) Appl. No.: 16/954,776

(22) PCT Filed: Oct. 30, 2019

(86) PCT No.: PCT/CN2019/114174
§ 371 (c)(1),
(2) Date: Jun. 17, 2020

(87) PCT Pub. No.: WO2020/248474
PCT Pub. Date: Dec. 17, 2020

(65) Prior Publication Data
US 2022/0115513 A1    Apr. 14, 2022

(30) Foreign Application Priority Data
Jun. 11, 2019  (CN) .......................... 201910500728.3

(51) Int. Cl.
*H01L 29/423*    (2006.01)
*H01L 29/06*    (2006.01)
(Continued)

(52) U.S. Cl.
CPC ................. *H01L 29/42392* (2013.01); *H01L 21/823807* (2013.01); *H01L 21/823814* (2013.01);
(Continued)

(58) Field of Classification Search
CPC ....... H01L 29/42392; H01L 21/823807; H01L 21/823814; H01L 27/0922; H01L 29/0665;
(Continued)

(56) References Cited

U.S. PATENT DOCUMENTS

| 10,008,583 B1 | 6/2018 | Rodder et al. |
| 2012/0007052 A1* | 1/2012 | Hobbs ................ H01L 27/1211 977/762 |

(Continued)

FOREIGN PATENT DOCUMENTS

| CN | 108172546 | 6/2018 |
| CN | 108364910 A | 8/2018 |

(Continued)

OTHER PUBLICATIONS

International Search Report, dated Jun. 11, 2019, 10 pps.

*Primary Examiner* — Tong-Ho Kim
(74) *Attorney, Agent, or Firm* — Goodwin Procter LLP

(57) ABSTRACT

A method for manufacturing a stacked gate-all-around nano-sheet CMOS device, including: providing a substrate with a fin structure, where a channel layer for an NMOS is a sacrificial layer for a PMOS, a channel layer for the PMOS is a sacrificial layer for the NMOS; and mobility of holes in the second material is greater than mobility of holes in the first material; forming a dummy gate stack extending across the fin structure; forming source-or-drain regions in the fin structure at two sides of the dummy gate stack; removing the dummy gate stack and the sacrificial layers covered by the (Continued)

dummy gate stack, to expose a surface of a part of the channel layer that is located between the source-or-drain regions, where a nano-sheet array is formed by the channel layer with the exposed surface; and forming a gate stack structure surrounding each nano sheet in the nano-sheet array.

12 Claims, 12 Drawing Sheets

(51) Int. Cl.
  *H01L 21/8238* (2006.01)
  *H01L 29/66* (2006.01)
  *H01L 29/786* (2006.01)
  *H01L 27/092* (2006.01)
(52) U.S. Cl.
  CPC ...... *H01L 27/0922* (2013.01); *H01L 29/0665* (2013.01); *H01L 29/66545* (2013.01); *H01L 29/78618* (2013.01); *H01L 29/78696* (2013.01)

(58) Field of Classification Search
  CPC ......... H01L 29/66545; H01L 29/78618; H01L 29/78696
  USPC ........................................................ 257/288
  See application file for complete search history.

(56) References Cited

U.S. PATENT DOCUMENTS

| | | | |
|---|---|---|---|
| 2018/0122899 A1* | 5/2018 | Guillorn | ............ H01L 21/28017 |
| 2019/0058052 A1 | 2/2019 | Frougier et al. | |

FOREIGN PATENT DOCUMENTS

| | | | | |
|---|---|---|---|---|
| CN | 108878277 A | 11/2018 | | |
| CN | 109411352 A | 3/2019 | | |
| CN | 110246806 A | 9/2019 | | |
| JP | 62054459 A | * | 3/1987 | ........... H01L 29/165 |

* cited by examiner

STRUCTURE OF STACKED GATE-ALL-AROUND NANO-SHEET CMOS DEVICE AND METHOD FOR MANUFACTURING THE SAME

This application is the national phase of International Application No. PCT/CN2019/114174, titled "STRUCTURE OF STACKED GATE-ALL-AROUND NANO-SHEET CMOS DEVICE AND METHOD FOR MANUFACTURING THE SAME," filed on Oct. 30, 2019, which claims priority to Chinese Patent Application No. 201910500728.3, titled "STRUCTURE OF STACKED GATE-ALL-AROUND NANO-SHEET CMOS DEVICE AND METHOD FOR MANUFACTURING THE SAME," filed on Jun. 11, 2019 with the China National Intellectual Property Administration, which is incorporated herein by reference in its entirety.

FIELD

The present disclosure relates to the technical field of semiconductor, and in particular, to a structure of a stacked gate-all-around nano-sheet CMOS device and a method for manufacturing the same.

BACKGROUND

A feature dimension of an integrated circuit is continuously miniaturized. Conventional triple-gate or double-gate fin field-effect transistors (FinFETs) are limited for nodes below 5 nm, and a gate-all-around (GAA) nano-sheet transistor compatible with a mainstream of a post-HKMG (high-K & metal gate) FinFET technique are becoming a key structure in a next generation for achieving miniaturization. There are two types of a channel structure in the GAA nano-sheet transistor, i.e. a nano-wire (NW) type and a nano-sheet (NS) type.

In a novel structure of the post-HKMG FinFET technique, a stacked NW or NS structure is selectively formed in a post gate (where a source and a drain are still fins), and then a GAA device is formed.

A conventional integration technique for a stacking NS FET is based on a GeSi/Si stack, in which a <100> orientation of a (100) lattice plane of Si is applied for a device channel in both an NMOS and a PMOS. Mobility of holes and a device performance are improved in the NMOS, but are slightly deteriorated in the PMOS. Therefore, performances of the NMOS and the PMOS do not match with each other, resulting in a serious impact on designing a CMOS device and a circuit.

SUMMARY

A structure of a stacked gate-all-around nano-sheet CMOS device and a method for manufacturing such structure are provided according to embodiments of the present disclosure. Addressed is a problem of performance mismatch between a NMOS and a PMOS in a single-channel CMOS, which is caused by low mobility of holes in a Si-channel PMOS.

In a first aspect, a method for manufacturing a stacked gate-all-around nano-sheet CMOS device is provided according to an embodiment of the present disclosure. The method includes:

providing a substrate, where: a support portion is provided at a side of the substrate, sacrificial layers and channel layers are alternately stacked on the support portion, and the sacrificial layers and the channel layers are along an extending direction of the support portion; the support portion, the sacrificial layers and the channel layers form a fin structure; a channel layer for a NMOS is made of a first material, a channel layer for a PMOS is made of a second material; the channel layer for the NMOS is a sacrificial layer for the PMOS, the channel layer for the PMOS is a sacrificial layer for the NMOS; and mobility of holes in the second material is greater than mobility of holes in the first material;

forming a dummy gate stack extending across the fin structure;

forming source-or-drain regions in the fin structure at two sides of the dummy gate stack;

removing, sequentially for one and another of the NMOS and the PMOS, the dummy gate stack and the sacrificial layers covered by the dummy gate stack, to expose a surface of a part of the channel layer that is located between the source-or-drain regions, where a nano-sheet array is formed by the channel layer with the exposed surface; and forming a gate stack structure surrounding each nano sheet in the nano-sheet array.

In an optional embodiment, removing, sequentially for one and another of the NMOS and the PMOS, the dummy gate stack and the sacrificial layers covered by the dummy gate stack includes:

covering the whole PMOS and exposing the NMOS, by using an etching mask layer; removing the dummy gate stack for the NMOS with an etching process that etches the dummy gate stack without etching the first material, to expose a channel surface of the first material and the second material; and removing the second material in a channel region for the NMOS, with an etching process that etches the second material without etching the first material, to separate channels of multiple layers of the first material for the NMOS; and covering the whole NMOS and exposing the PMOS, by using another etching mask layer; removing the dummy gate stack for the PMOS with an etching process that etches the dummy gate stack without etching the second material, to expose another channel surface of the first material and the second material; and removing the first material in a channel region for the PMOS, with an etching process that etches the first material without etching the second material, to separate channels of multiple layers of the second material for the PMOS.

In an optional embodiment, the etching processes includes dry etching and wet etching.

In an optional embodiment, forming source-or-drain regions in the fin structure at the two sides of the dummy gate stack includes:

forming the source-or-drain regions in the fin structure at the two sides of the dummy gate stack through source-or-drain selective epitaxy, doping, and rapid thermal annealing.

In an optional embodiment, the first material is Si, and the mobility of holes in the second material is greater than 100 cm$^2$/V·s.

In an optional embodiment, the second material includes GeSi, Ge and $Si_{1-x}Ge_x$.

In an optional embodiment, each etching mask layer includes photoresist, polymer, amorphous carbon (a-C), an organic insulator, spin-on glass, a low-dielectric-constant (low-k) material, and silicon nitride.

In a second aspect, a structure of a stacked gate-all-around nano-sheet CMOS device is provided according to an embodiment of the present disclosure, including:

a substrate, where the substrate includes a region for an NMOS and a region for a PMOS, a channel layer of the NMOS is made of a first material, a channel layer of the PMOS is made of a second material, and mobility of holes in the second material is greater than mobility of holes in the first material;

a nano-sheet array, located on the substrate, where the nano-sheet array includes multiple nano sheets;

a gate stack structure, surrounding the nano sheet in the nano-sheet array; and source-or-drain regions, in connection with the multiple nano sheets.

In an optional embodiment, the first material is Si, and the mobility of holes in the second material is greater than 100 $cm^2/V \cdot s$.

In an optional embodiment, the second material includes GeSi, Ge and $Si_{1-x}Ge_x$.

The structure of the stacked gate-all-around nano-sheet CMOS device and the method for manufacturing the structure are provided according to embodiments of the present disclosure. A first material serves as a channel of an NMOS device, a second material serves as a channel of a PMOS device, and the mobility of holes is greater in the second material than in the first material. Therefore, the mobility of holes and a device performance can be improved for both the NMOS and the PMOS, and the performances of the NMOS and the PMOS can match with each other. CMOS devices and circuits with a good performance can be obtained.

DETAILED DESCRIPTION OF EMBODIMENTS

To make objectives, technical solutions and advantages of the embodiments of the present disclosure clearer, the technical solutions according to the embodiments of the present disclosure are described in detail as follows in conjunction with the drawings. Obviously, the described embodiments are only a part of the embodiments of the present disclosure, but not all the embodiments. Based on the embodiments of the present disclosure, all other embodiments obtained by a person of ordinary skill in the art without creative work fall within the protection scope of the present disclosure.

A method for manufacturing a stacked gate-all-around nano-sheet CMOS device is provided according to an embodiment of the present disclosure. The method includes steps S1 to S12.

Figure 1A:
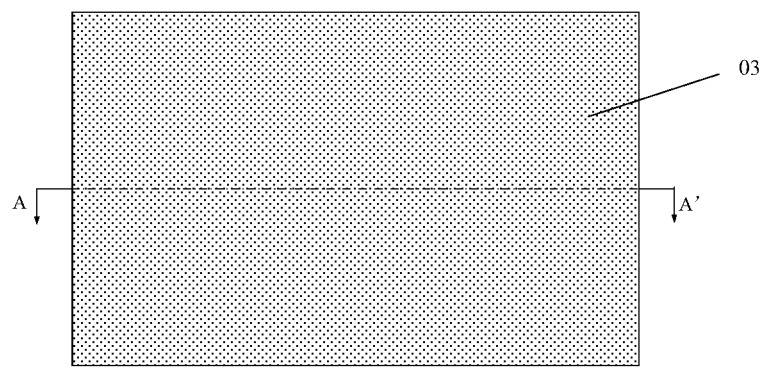
FIGS. 1a and 1b are a top view and a cross-sectional view along a direction A-A', of a stacked structure of an active region formed on a substrate, according to an embodiment of the present disclosure.
Figure 1B:
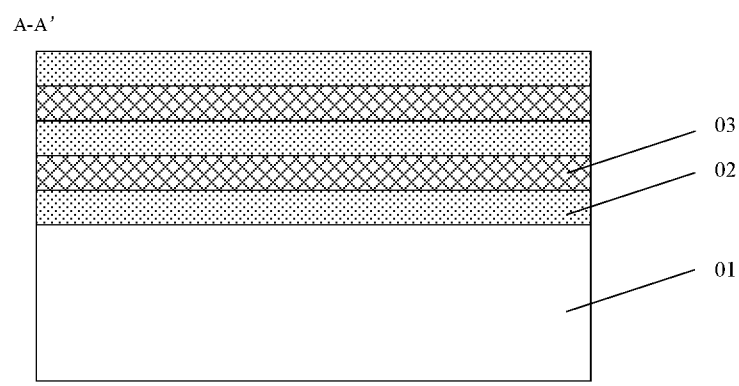

In step S1, a Si/GeSi stack of an active region is formed on a substrate 01 through alternate epitaxy. Si is denoted as 02, and GeSi is denoted as 03, as shown in FIGS. 1a and 1b.

Figure 2A:
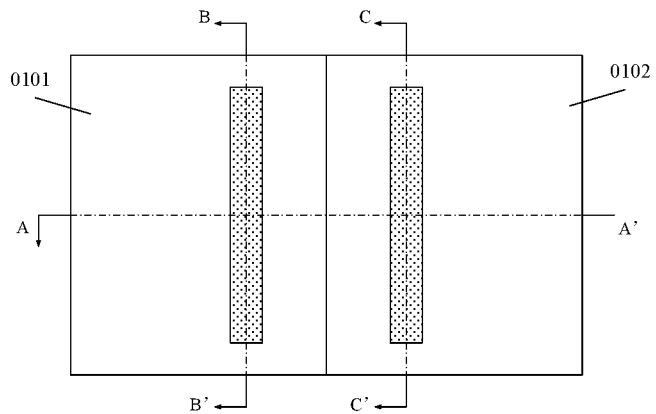
FIGS. 2a, 2b and 2c are a top view, a cross-sectional view along a gate direction A-A', and cross-sectional views along a channel direction B-B' of a NMOS and along a channel direction C-C' of a PMOS, of a fin structure and a well structure that are formed for the NMOS and the PMOS, according to an embodiment of the present disclosure.
Figure 2B:
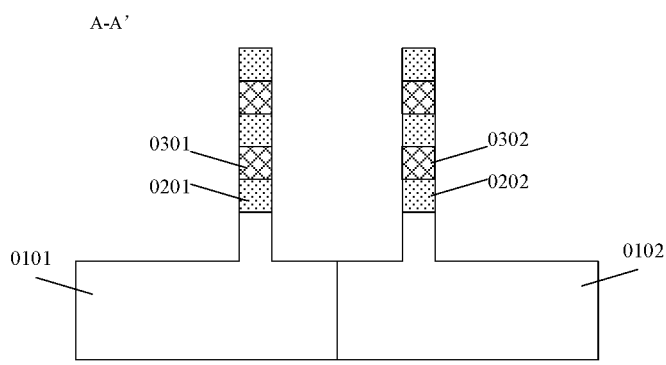
Figure 2C:
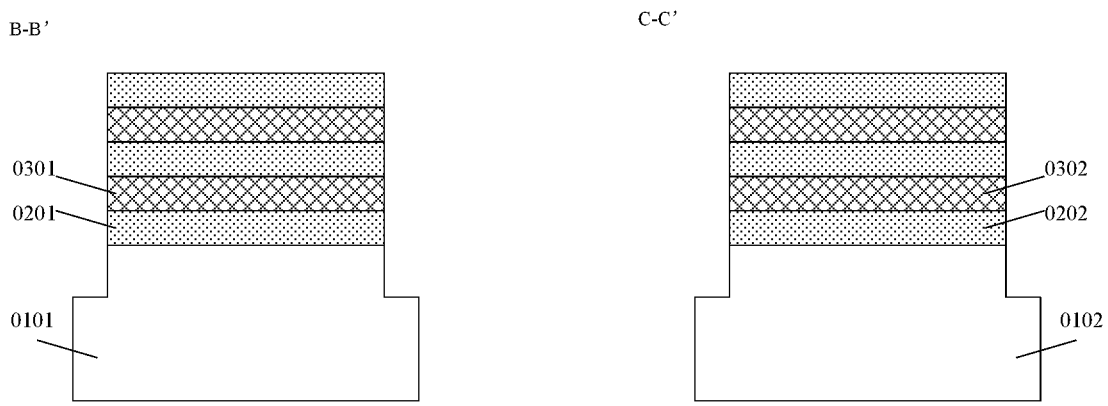

In step S2, fin structures for a NMOS and a PMOS are formed through photolithography and etching. Si and GeSi in the stack are denoted as 0201 and 0301, respectively, in the NMOS. Si and GeSi in the stack are denoted as 0201 and 0301, respectively, in the PMOS. A well region 0101 for the NMOS and a well region 0102 for the PMOS are respectively formed through ion implantation and annealing. Reference is made to FIGS. 2a, 2b and 2c.

Figure 3A:
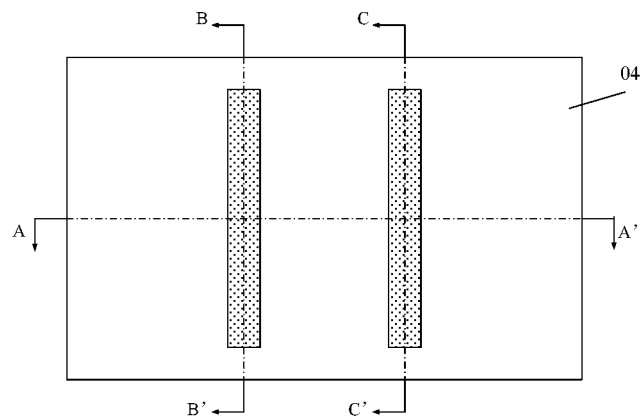
FIGS. 3a, 3b and 3c are a top view, a cross-sectional view along a gate direction A-A', and cross-sectional views along a channel direction B-B' of a NMOS and along a channel direction C-C' of a PMOS, of a formed STI according to an embodiment of the present disclosure.
Figure 3B:
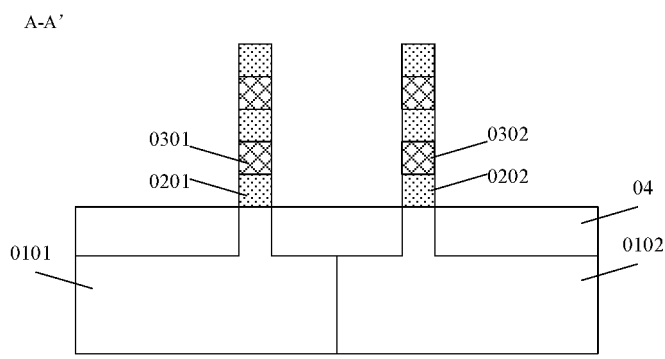
Figure 3C:
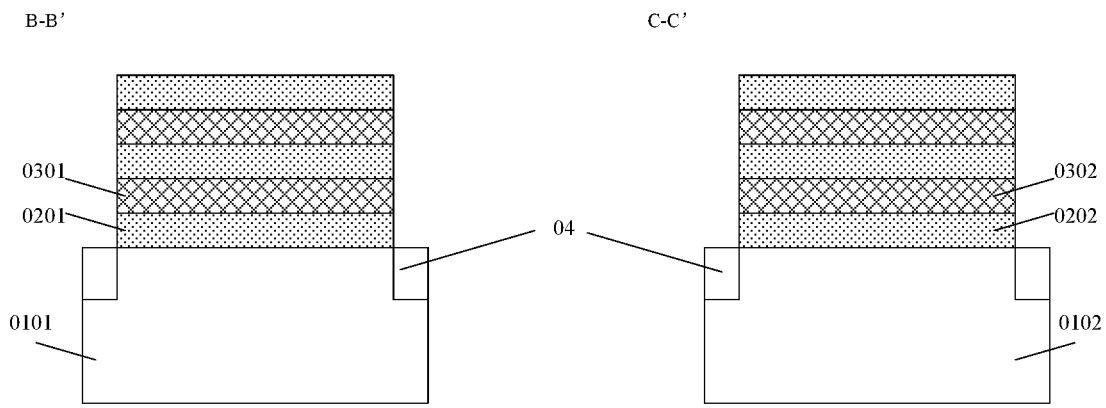

In step S3, an insulating medium is deposited at low temperature and etched, to form STI (shallow trench isolation) 04. The STI is etched to a plane that is flush with a bottom surface of the bottommost channel of Si 02. Reference is made to FIGS. 3a, 3b and 3c.

Figure 4A:
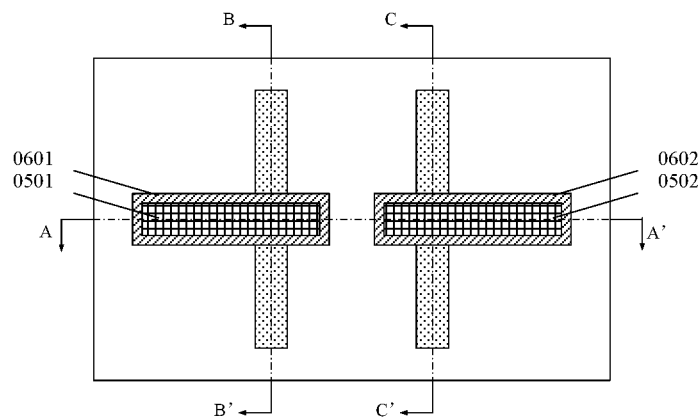
FIGS. 4a, 4b and 4c are a top view, a cross-sectional view along a gate direction A-A', and cross-sectional views along a channel direction B-B' of a NMOS and along a channel direction C-C' of a PMOS, of a dummy gate stack and an outer sidewall that are formed extending across a fin structure, according to an embodiment of the present disclosure.
Figure 4B:
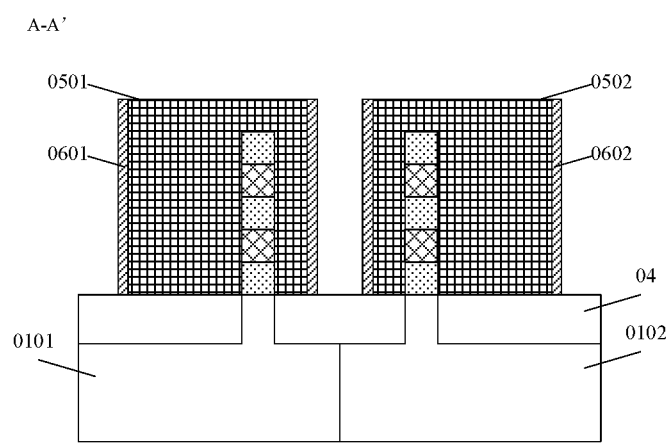
Figure 4C:
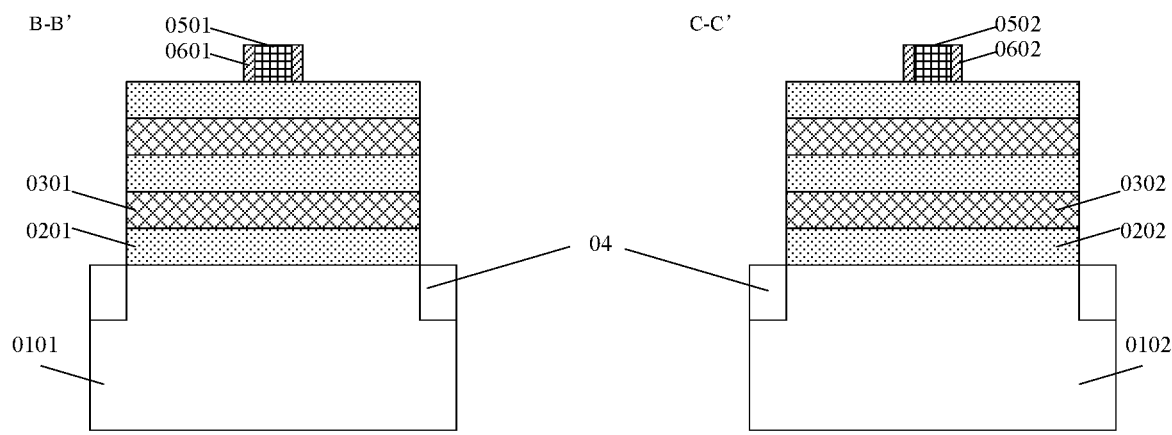

In step S4, a dummy gate stack material 05 is deposited to wrap the Si/GeSi stack. The dummy gate stack material includes a gate insulating layer and a dummy gate stack, which are generally silicon oxide and polysilicon, respectively. A dummy gate stack 0501 for the NMOS and a dummy gate stack 0502 for the PMOS are respectively formed through photolithography and etching. An outer sidewall material 06 is deposited to wrap the Si/GeSi stack. An outer sidewall 0601 for the NMOS and an outer sidewall 0602 for the PMOS are respectively formed. Reference is made to FIGS. 4a, 4b and 4c.

In an optional embodiment, a channel material located outside the sidewall is etched, and then a sidewall material is deposited and subject to anisotropic etching, to form an inner sidewall structure.

In an optional embodiment, a source-or-drain region is formed through source-or-drain selective epitaxy, doping, and rapid thermal annealing.

Figure 5A:
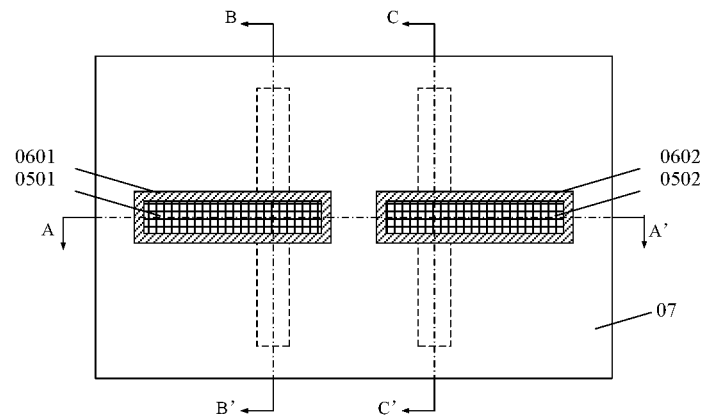
FIGS. 5a, 5b and 5c are a top view, a cross-sectional view along a gate direction A-A', and cross-sectional views along a channel direction B-B' of a NMOS and along a channel direction C-C' of a PMOS, of a structure obtained by depositing and planarizing an ILD 0 layer and exposing a top structure of a dummy gate stack for the NMOS and the PMOS, according to an embodiment of the present disclosure.
Figure 5B:
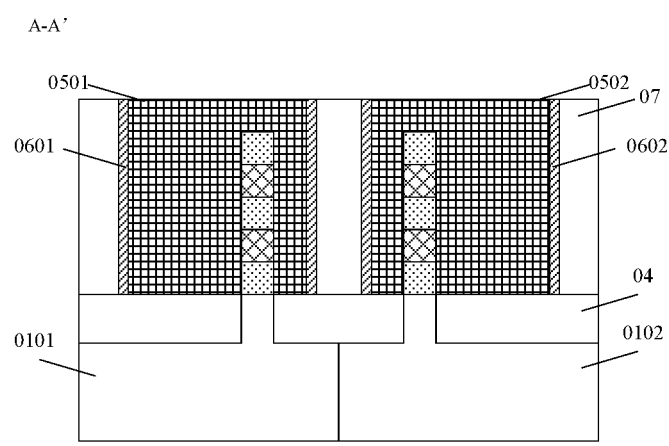
Figure 5C:
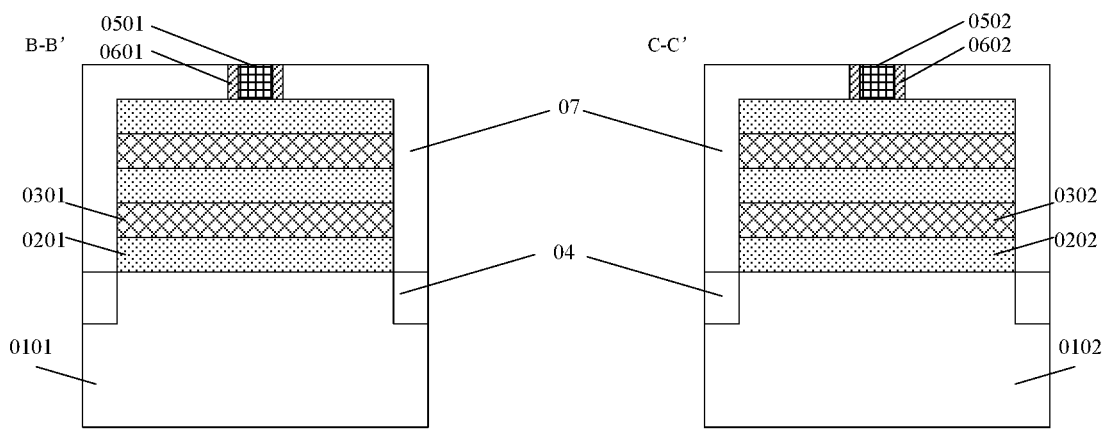

In step S5, an interlayer dielectric (ILD) 0 layer 07 that covers the NMOS/PMOS is deposited, and tops of the dummy gate stacks for the NMOS and the PMOS are exposed through chemical mechanical polishing (CMP). Reference is made to FIGS. 5a, 5b and 5c.

Figure 6A:
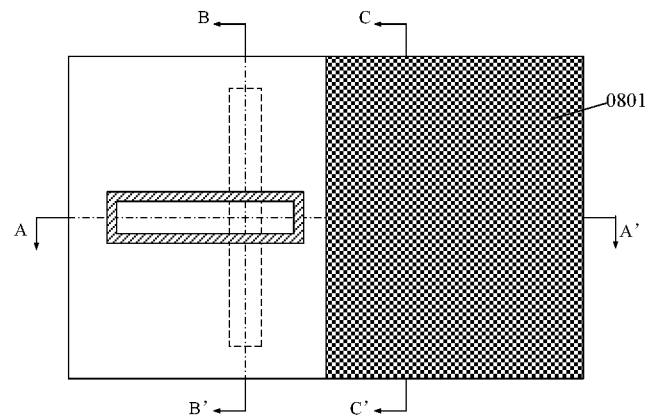
FIGS. 6a, 6b and 6c are a top view, a cross-sectional view along a gate direction A-A', and cross-sectional views along a channel direction B-B' of a NMOS and along a channel direction C-C' of a PMOS, of a structure obtained by selectively etching a dummy gate stack for the NMOS, according to an embodiment of the present disclosure.
Figure 6B:
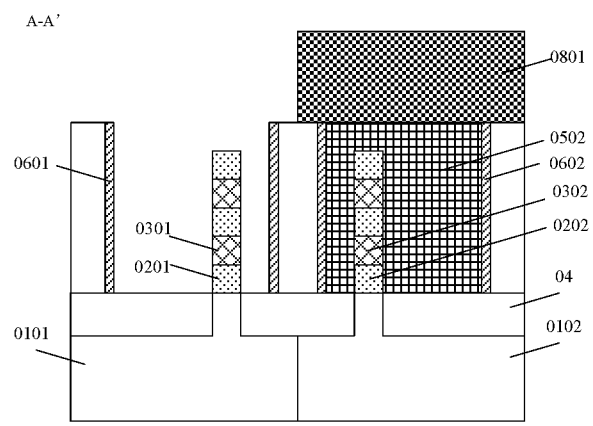
Figure 6C:
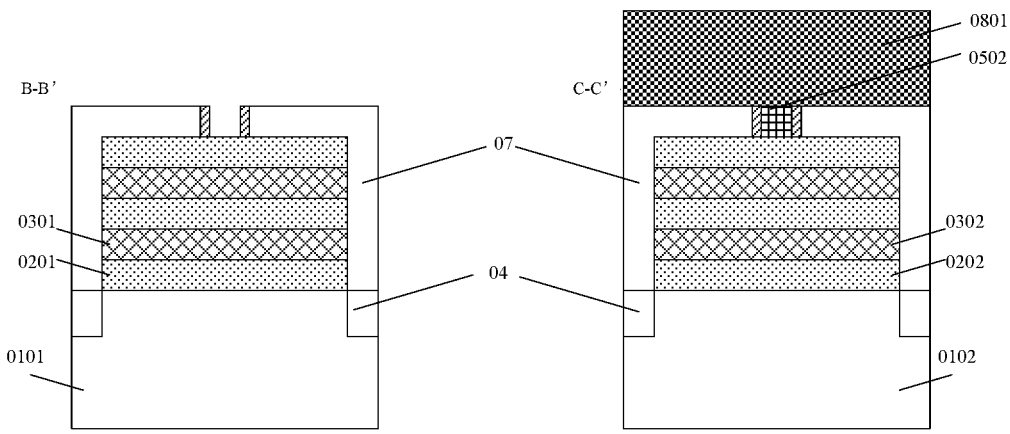

In step S6, the dummy gate stack for the NMOS is selectively etched. The whole PMOS is covered and the NMOS is exposed, by using an etching mask layer 0801. The dummy gate stack 0501 for the NMOS is removed through an etching process that etches the dummy gate stack without etching Si, to expose a surface of the Si channels. Reference is made to FIGS. 6a, 6b, and 6c.

The first etching mask layer 0801 may be an insulating filler, such as photoresist, polymer, amorphous carbon (a-C), an organic insulator, spin-on glass, a low-dielectric-constant (low-k) material, or silicon nitride.

Figure 7A:
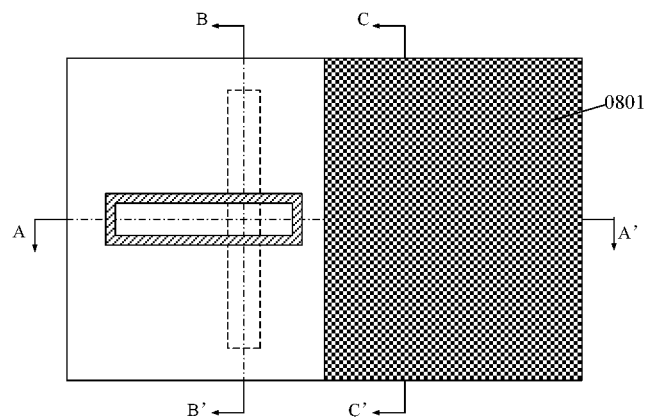
FIGS. 7a, 7b and 7c are a top view, a cross-sectional view along a gate direction A-A', and cross-sectional views along a channel direction B-B' of a NMOS and along a channel direction C-C' of a PMOS, of a structure obtained by releasing a channel for the NMOS, according to an embodiment of the present disclosure.
Figure 7B:
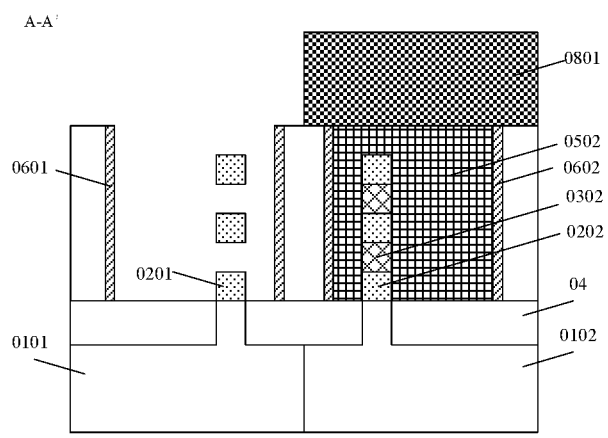
Figure 7C:
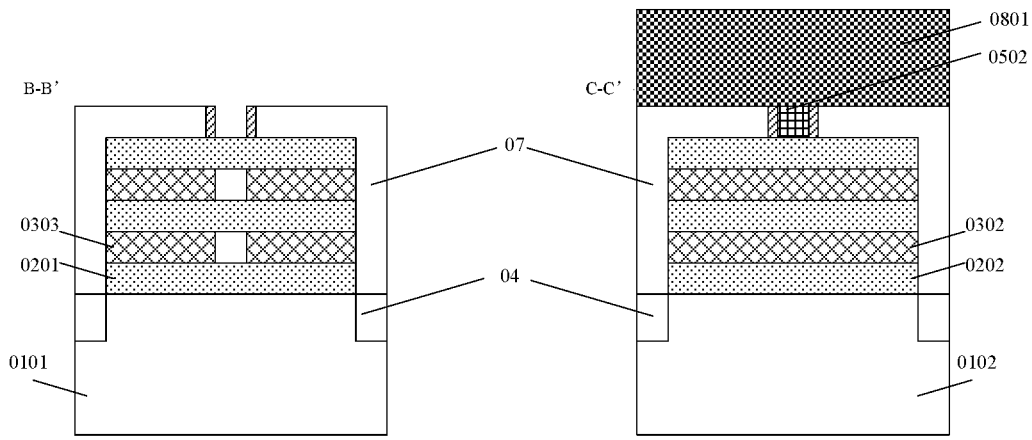

In step S7, a channel for the NMOS is released. GeSi is removed in a channel region, through an etching process that etches GeSi without etching Si, to separate multiple layers of channels of Si 0201 for the NMOS. Reference is made to FIGS. 7a, 7b, and 7c.

Figure 8A:
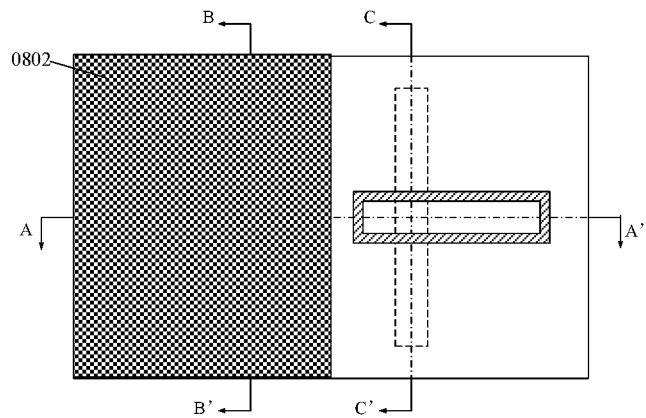
FIGS. 8a, 8b and 8c are a top view, a cross-sectional view along a gate direction A-A', and cross-sectional views along a channel direction B-B' of a NMOS and along a channel direction C-C' of a PMOS, of a structure obtained by selectively etching a dummy gate stack for the PMOS, according to an embodiment of the present disclosure.
Figure 8B:
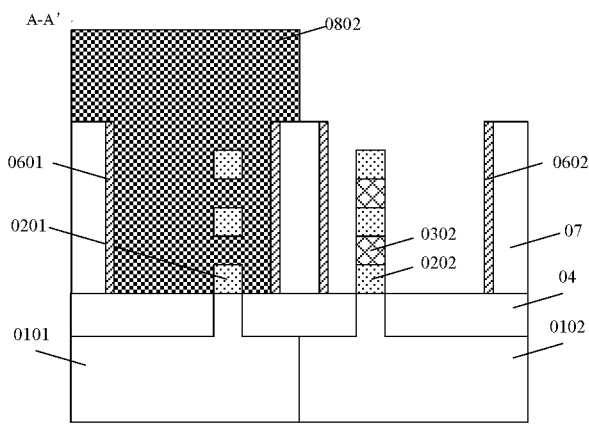
Figure 8C:
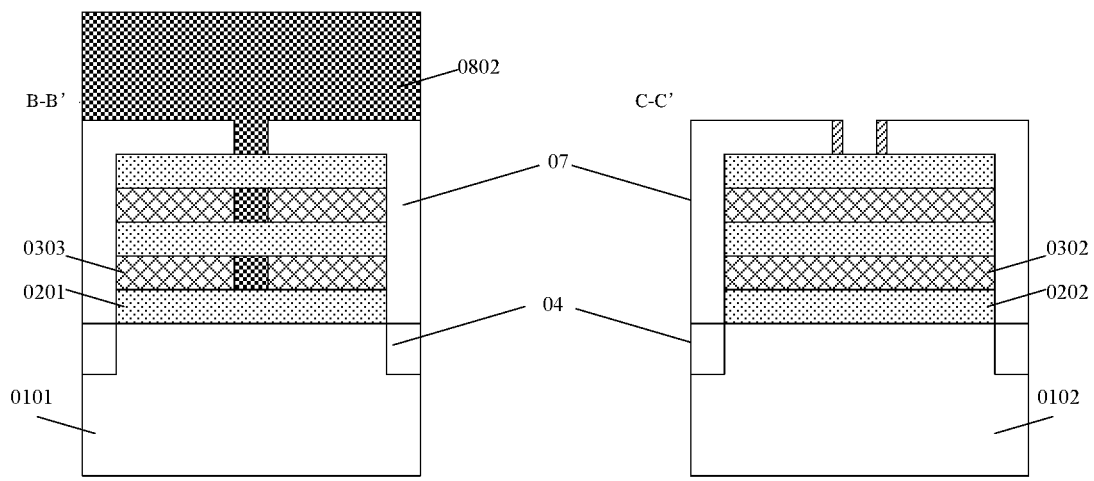

In step S8, the dummy gate stack for the PMOS is selectively etched. The whole NMOS is covered and the PMOS is exposed, by using an etching mask layer 0802. The dummy gate stack 0502 for the PMOS is removed through an etching process that etches the dummy gate stack without etching GeSi, to expose a surface of the GeSi channels. Reference is made to FIGS. 8a, 8b, and 8c.

The second etching mask layer 0802 may be photoresist, polymer, a-C, an organic insulator, spin-on glass, a low-k material, and silicon nitride.

Figure 9A:
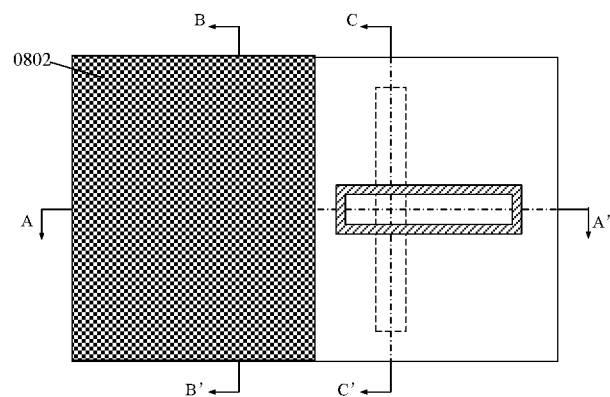
FIGS. 9a, 9b and 9c are a top view, a cross-sectional view along a gate direction A-A', and cross-sectional views along a channel direction B-B' of a NMOS and along a channel direction C-C' of a PMOS, of a structure obtained by releasing a channel for the PMOS, according to an embodiment of the present disclosure.
Figure 9B:
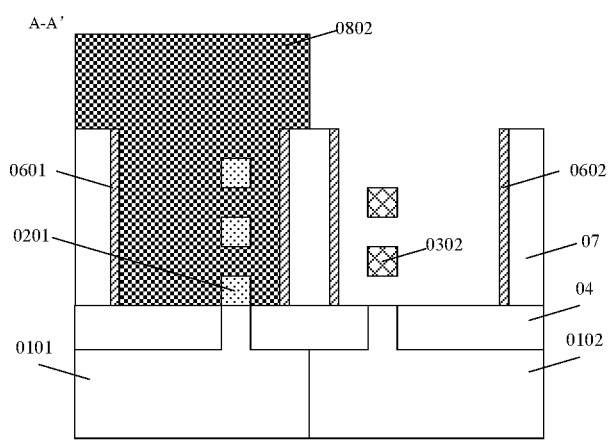
Figure 9C:
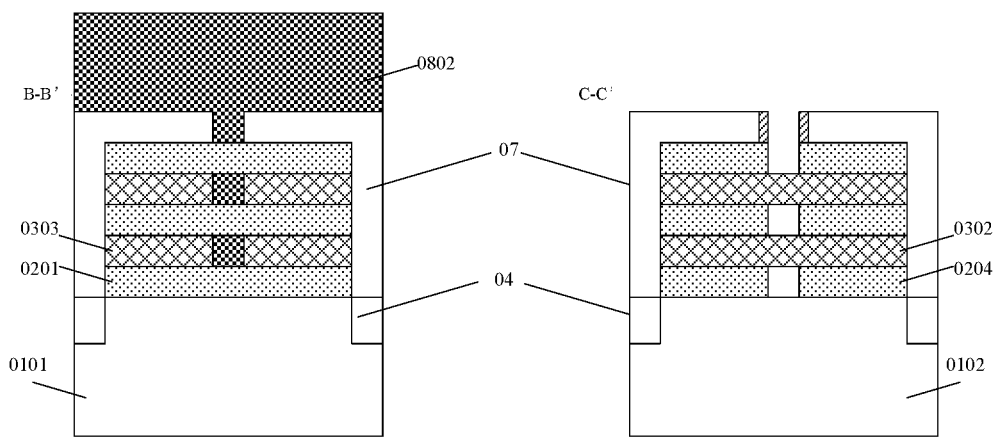

In step S9, a channel for the PMOS is released. Si is removed in a channel region, through an etching process that etches Si without etching GeSi, to separate multiple layers of channels of GeSi 0302 for the PMOS. Reference is made to FIGS. 9a, 9b, and 9c.

The aforementioned etching process includes dry etching or wet etching.

Figure 10A:
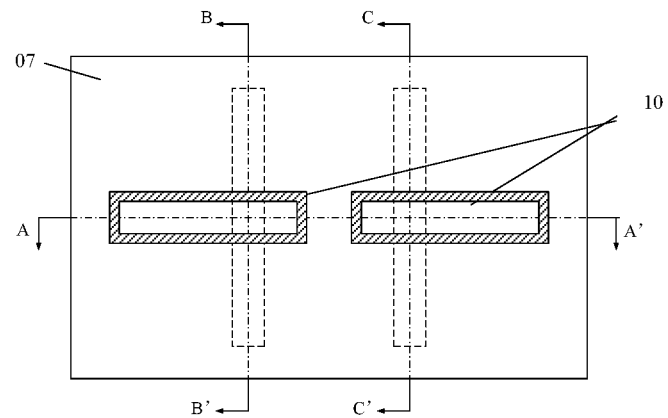
FIGS. 10a, 10b and 10c are a top view, a cross-sectional view along a gate direction A-A', and cross-sectional views along a channel direction B-B' of a NMOS and along a channel direction C-C' of a PMOS, of a structure obtained by depositing an HK/WFL layer for the NMOS and an HK/WFL layer for the PMOS, according to an embodiment of the present disclosure.
Figure 10B:
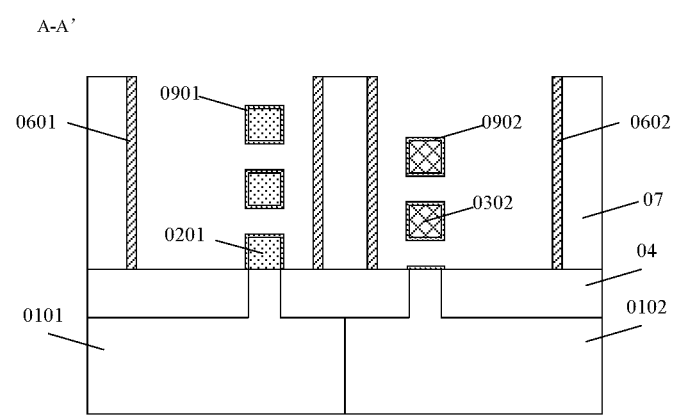
Figure 10C:
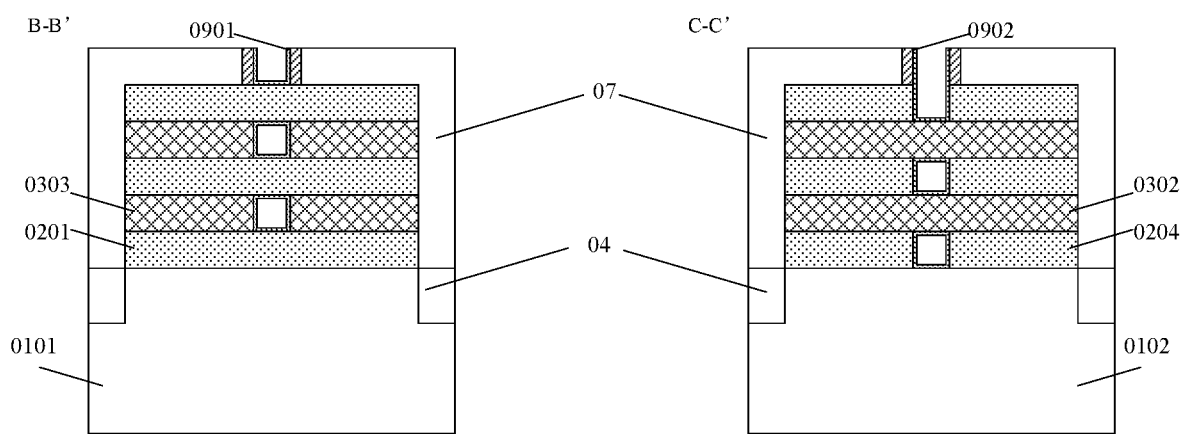

In step S10, an HK/WFL layer (denoted as 0901) for the NMOS is deposited, and an HK/WFL layer (denoted as 0902) for the PMOS is deposited. Reference is made to FIGS. 10a, 10b, and 10c.

Figure 11A:
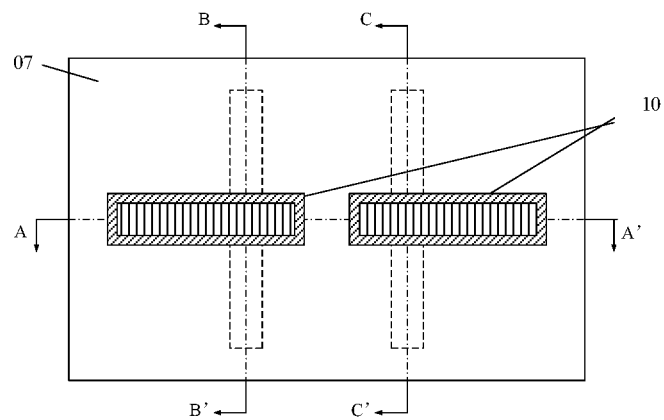
FIGS. 11a, 11b and 11c are a top view, a cross-sectional view along a gate direction A-A', and cross-sectional views along a channel direction B-B' of a NMOS and along a channel direction C-C' of a PMOS, of a structure obtained by filling and planarizing a gate conductive material for the NMOS and the PMOS, according to an embodiment of the present disclosure.
Figure 11B:
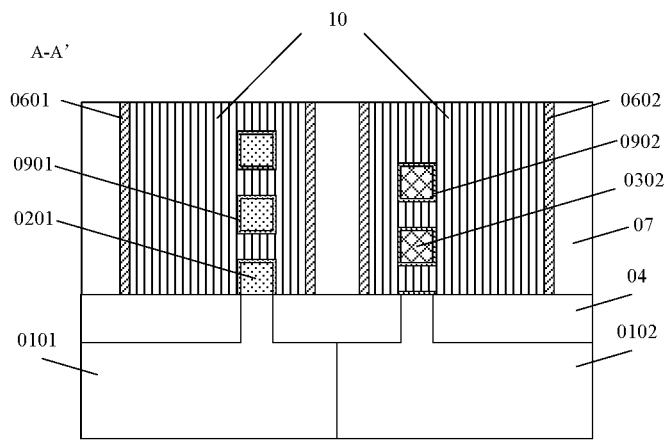
Figure 11C:
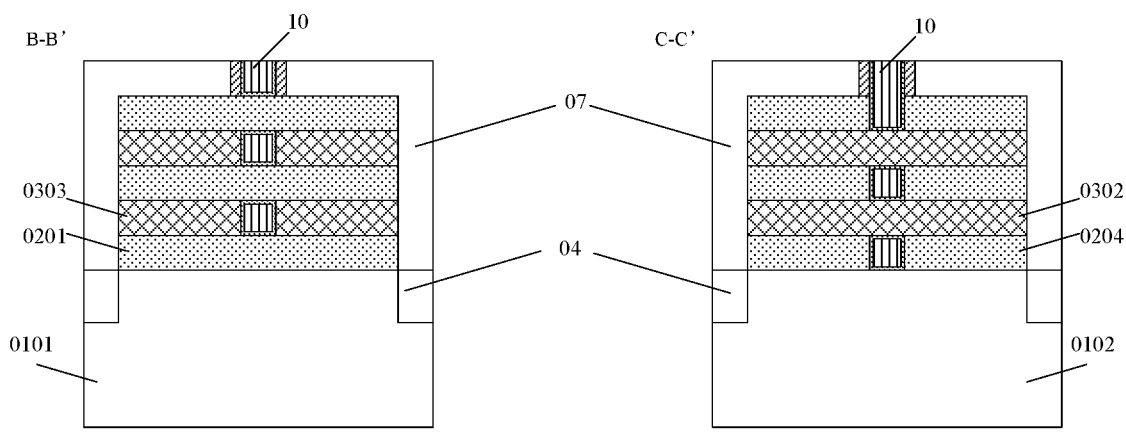

In step S11, a gate conductive material 10 for the NMOS and the PMOS is used for filing, and the gate conductive material 10 is planarized (where a top of ILD 0 layer 07 is exposed). Reference is made to FIGS. 11a, 11b, and 11c.

Figure 12A:
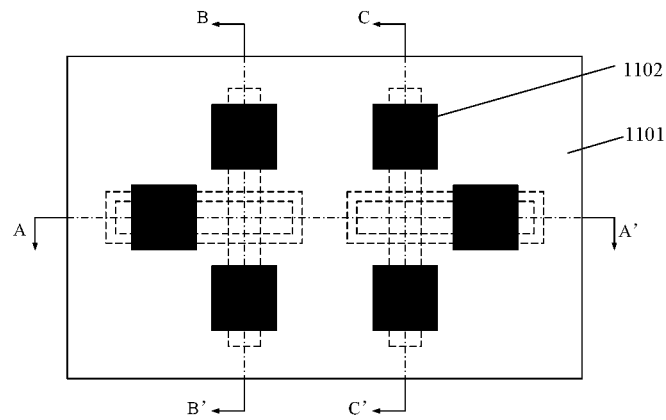
FIGS. 12a, 12b and 12c are a top view, a cross-sectional view along a gate direction A-A', and cross-sectional views along a channel direction B-B' of a NMOS and along a channel direction C-C' of a PMOS, of a structure obtained by depositing and planarizing an ILD 1 layer, etching a through-hole, and filling with and planarizing a through-hole material, according to an embodiment of the present disclosure.
Figure 12B:
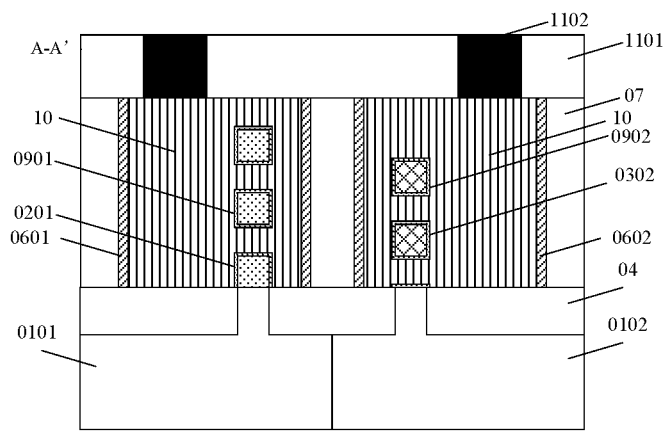
Figure 12C:
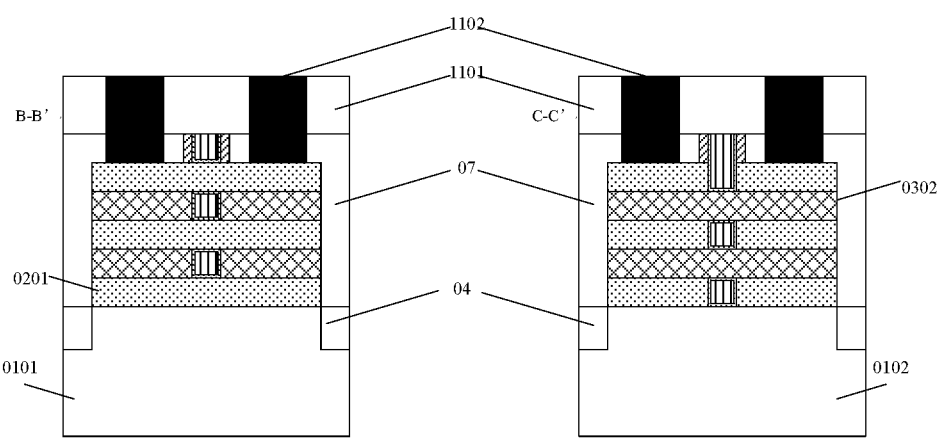

In step S12, an ILD 1 layer 1101 is deposited and planarized, a through-hole is etched, and a through-hole material 1102 is used for filling and is planarized. Reference is made to FIGS. 12a, 12b, and 12c.

In an optional embodiment, GeSi may be replaced with another material with high mobility of holes. The mobility of holes is greater in such material than in a silicon-based material under a same condition.

In an optional embodiment, the mobility of holes in such material is greater than 100 $cm^2/V \cdot s$ under a high electric field.

In an optional embodiment, such material may be, for example, Ge or $Si_{1-x}Ge_x$.

The structure of the stacked gate-all-around nano-sheet CMOS device and the method for manufacturing the structure are provided according to an embodiment of the present disclosure. Si serves as the channel of an NMOS device, improving mobility of holes and a device performance of the NMOS. GeSi serves as the channel of a PMOS device, improving mobility of holes and a device performance of the PMOS. The performances of the NMOS and the PMOS can match with each other, so as to obtain CMOS devices and circuits of a good performance.

A structure of a stacked gate-all-around nano-sheet CMOS device is further provided according to an embodiment of the present disclosure, as shown in FIGS. 12b and 12c. The structure of the stacked gate-all-around nano-sheet CMOS device includes a substrate, a nano-sheet array, a gate stack structure, and source-or-drain regions.

The substrate includes a region for an NMOS and a region for a PMOS. A channel layer of the NMOS is made of a first material, a channel layer of the PMOS is made of a second material, and mobility of holes in the second material is greater than mobility of holes in the first material.

The nano-sheet array is located on the substrate, and includes multiple nano sheets.

The gate stack structure surrounds the each nano sheet in the nano-sheet array.

The source-or-drain regions are in connection with the multiple nano sheets.

In an optional embodiment, the first material is Si, and the mobility of holes in the second material is greater than 100 $cm^2/V \cdot s$.

In an optional embodiment, the second material includes GeSi, Ge and $Si_{1-x}Ge_x$.

The structure of the stacked gate-all-around nano-sheet CMOS device is provided according to an embodiment of the present disclosure. A first material serves as a channel of an NMOS device, a second material serves as a channel of a PMOS device, and the mobility of holes is greater in the second material than in the first material. Therefore, the mobility of holes and a device performance can be improved for both the NMOS and the PMOS, and the performances of the NMOS and the PMOS can match with each other. CMOS devices and circuits with a good performance can be obtained.

Described above are only specific embodiments of the present disclosure, and the present disclosure is not limited thereto. Any modification or replacement, which can be easily made by those skilled in the art within the technical scope disclosed herein, should fall within the protection scope of the present disclosure. Therefore, the protection scope of the present disclosure should be subject to the protection scope of the claims.

The invention claimed is:

1. A method for manufacturing a stacked gate-all-around nano-sheet CMOS device, comprising:
   providing a substrate, the substrate comprising a region for an NMOS and a region for a PMOS, wherein:
      a support portion is provided at a side of the substrate, at least one sacrificial layer and at least one channel layer are alternately stacked on the support portion, and the at least one sacrificial layer and the at least one channel layer are along an extending direction of the support portion;
      the support portion, the at least one channel layer and the at least one channel layer form a fin structure;
      the at least one channel layer in the region for the NMOS is made of a first material, and the at least one channel layer in the region for the PMOS is made of a second material; and
      mobility of holes in the second material is greater than mobility of holes in the first material;
   forming a dummy gate stack extending across the fin structure;
   forming source-or-drain regions in the fin structure at two sides of the dummy gate stack;
   removing, sequentially for one and another of the NMOS and the PMOS, the dummy gate stack and the at least one sacrificial layer covered by the dummy gate stack, to expose a surface of a part of the at least one channel layer that is located between the source-or-drain regions, wherein a nano-sheet array is formed by the at least one channel layer with the exposed surface; and
   forming a gate stack structure surrounding each nano sheet in the nano-sheet array;
   wherein the fin structure comprises a first fin located in the region for the NMOS and a second fin located in the region for the PMOS, and providing the substrate comprises:
      forming a stack comprising at least one first layer and at least one second layer on a base layer of the substrate, wherein the at least one first layer and the at least one second layer are interleaved in the stack; and
      etching the stack and the base layer to form the fin structure, wherein the at least one first layer remained after the etching serves as the at least one channel layer in the first fin and the at least one sacrificial layer in the second fin, and the at least one second layer remained after the etching serves as the at least one channel layer in the second fin and the at least one sacrificial layer in the first fin;
   wherein one or both of a quantity of the at least one first layer and a quantity of the at least one second layer are greater than one.

2. The method according to claim 1, wherein removing, sequentially for one and another of the NMOS and the PMOS, the dummy gate stack and the at least one sacrificial layer covered by the dummy gate stack comprises:
   covering the whole PMOS and exposing the NMOS, by using an etching mask layer;
   removing the dummy gate stack for the NMOS with an etching process that etches the dummy gate stack without etching the first material, to expose a channel surface of the first material and the second material;
   removing the second material in a channel region for the NMOS, with an etching process that etches the second material without etching the first material, to separate channels of a plurality of layers of the first material for the NMOS;
   covering the whole NMOS and exposing the PMOS, by using another etching mask layer;
   removing the dummy gate stack for the PMOS with an etching process that etches the dummy gate stack without etching the second material, to expose another channel surface of the first material and the second material;
   removing the first material in a channel region for the PMOS, with an etching process that etches the first material without etching the second material, to separate channels of a plurality layers of the second material for the PMOS.

3. The method according to claim 2, wherein each etching process comprises dry etching or wet etching.

4. The method according to claim 2, wherein each etching mask layer comprises photoresist, polymer, amorphous carbon (a-C), an organic insulator, spin-on glass, a low-dielectric-constant (low-k) material, or silicon nitride.

5. The method according to claim 1, wherein forming source-or-drain regions in the fin structure at the two sides of the dummy gate stack comprises:
   forming the source-or-drain regions in the fin structure at the two sides of the dummy gate stack through source-or-drain selective epitaxy, doping, and rapid thermal annealing.

6. The method according to claim 1, wherein the first material is Si, and the mobility of holes in the second material is greater than 100 cm$^2$/V·s.

7. The method according to claim 6, wherein the second material comprises GeSi, Ge or $Si_{1-x}Ge_x$.

8. The method according to claim 1, wherein forming the gate stack structure surrounding each nano sheet in the nano-sheet array comprises:
   depositing, simultaneously for both the NMOS and the PMOS, a work function layer surrounding each of the at least one channel layer at the exposed surface of said channel layer; and
   forming, simultaneously for the PMOS and the NMOS, a gate material surrounding the work function layer.

9. A structure of a stacked gate-all-around nano-sheet CMOS device, comprising:
   a substrate, wherein the substrate comprises a region for an NMOS and a region for a PMOS;
   a nano-sheet array, located on the substrate, wherein the nano-sheet array comprises at least one channel layer of the NMOS and at least channel layer of the PMOS which are a plurality of nano sheets, the at least one channel layer of the NMOS is made of a first material, the at least one channel layer of the PMOS is made of a second material, and mobility of holes in the second material is greater than mobility of holes in the first material;
   a gate stack structure, surrounding each of the plurality of nano-sheets in the nano-sheet array; and
   source-or-drain regions, in connection with the plurality of nano sheets;
   wherein the at least one channel layer in the NMOS and the at least one channel layer in the PMOS are disposed in an interleaved manner along a direction perpendicular to the substrate;

wherein one or both of a quantity of the at least one channel layer in the NMOs and a quantity of the at least one channel layer in the PMOS are greater than one.

10. The structure according to claim 9, wherein the first material is Si, and the mobility of holes in the second material is greater than 100 cm$^2$/V·s.

11. The structure according to claim 9, wherein the second material comprises GeSi, Ge or $Si_{1-x}Ge_x$.

12. The structure according to claim 9, wherein the gate stack structure comprises:
   a first work function layer, surrounding each of the at least one channel layer of the NMOS;
   a second work function layer, surrounding each of the at least one channel layer of the PMOS;
   a first gate material layer, surrounding the first work function layer; and
   a second gate material layer, surrounding the second work function layer;
   wherein a material of the first work function layer is identical to a material of the second work function layer, and a material of the first gate material layer is identical to a material of the second gate material layer.

* * * * *